(12) United States Patent
Lee et al.

(10) Patent No.: US 7,250,635 B2
(45) Date of Patent: Jul. 31, 2007

(54) LIGHT EMITTING SYSTEM WITH HIGH EXTRACTION EFFICENCY

(75) Inventors: Ho-Shang Lee, El Sobrante, CA (US); Alexander Birman, Oakland, CA (US)

(73) Assignee: DiCon Fiberoptics, Inc., Richmond, CA (US)

( * ) Notice: Subject to any disclaimer, the term of this patent is extended or adjusted under 35 U.S.C. 154(b) by 45 days.

(21) Appl. No.: 10/773,943

(22) Filed: Feb. 6, 2004

(65) Prior Publication Data

US 2005/0173717 A1    Aug. 11, 2005

(51) Int. Cl.
    H05B 33/22        (2006.01)
(52) U.S. Cl. .......................... 257/98; 438/27
(58) Field of Classification Search ............... 438/27; 257/98
    See application file for complete search history.

(56) References Cited

U.S. PATENT DOCUMENTS

| | | | |
|---|---|---|---|
| 4,032,945 A * | 6/1977 | Mori et al. ................. | 257/95 |
| 5,008,718 A | 4/1991 | Fletcher et al. | |
| 5,779,924 A | 7/1998 | Krames et al. | |
| 5,955,749 A * | 9/1999 | Joannopoulos et al. ....... | 257/98 |
| 5,970,081 A * | 10/1999 | Hirayama et al. ............ | 372/96 |
| 6,323,063 B2 | 11/2001 | Krames et al. | |
| 6,420,732 B1 * | 7/2002 | Kung et al. .................. | 257/79 |
| 6,574,383 B1 * | 6/2003 | Erchak et al. ................ | 385/15 |
| 6,580,096 B2 | 6/2003 | Chen et al. | |
| 6,650,672 B2 | 11/2003 | Kito et al. | |
| 6,704,343 B2 * | 3/2004 | Deng et al. .................. | 372/97 |
| 6,831,302 B2 | 12/2004 | Erchak et al. | |
| 6,868,107 B2 | 3/2005 | Vurgaftman et al. | |
| 6,958,494 B2 * | 10/2005 | Lin et al. ..................... | 257/86 |

(Continued)

FOREIGN PATENT DOCUMENTS

WO    WO 01/91194 A1 * 11/2001

OTHER PUBLICATIONS

Erchak et al., "Enhanced coupling to vertical radiation using two-dimensional photonic crystal in a semiconductor light-emitting diode", Applied Physics Letters 78(5), Jan. 29, 2001, pp. 563-565 (published by the American Institute of Physics 2001).*

(Continued)

*Primary Examiner*—Jack Keith
*Assistant Examiner*—Ari M. Diacou
(74) *Attorney, Agent, or Firm*—Parsons Hsue & de Runtz LLP

(57) ABSTRACT

In an epitaxial structure of a solid state lighting system, electrical current injection into the active layer is used to excite the photon emission. The present invention employs a unique waveguide layer in the epitaxial structure for trapping the light generated by the active layer in the fundamental waveguide mode. Multiple photonic crystal regions located either outside or inside one or more current injection regions extract photons from the waveguide layer(s). This novel design optimizes the interplay of electrical pumping, radiation and optical extraction to increase the optical output to several times that of conventional LEDs. A transparent and conductive ITO layer is added to the surface of an epitaxial structure to reduce the interface reflection in addition to functioning as a current spreading layer. The present invention creates solid state lighting with high optical output and high power efficiency.

29 Claims, 6 Drawing Sheets

U.S. PATENT DOCUMENTS

| | | | |
|---|---|---|---|
| 6,987,288 B2 * | 1/2006 | Rattier et al. | 257/98 |
| 7,084,434 B2 * | 8/2006 | Erchak et al. | 257/98 |
| 7,138,666 B2 * | 11/2006 | Erchak et al. | 257/98 |
| 2001/0000943 A1 * | 5/2001 | Fukuoka et al. | 313/503 |
| 2001/0038656 A1 * | 11/2001 | Takeuchi et al. | 372/86 |
| 2002/0117672 A1 * | 8/2002 | Chu et al. | 257/79 |
| 2003/0020399 A1 * | 1/2003 | Moller et al. | 313/504 |
| 2003/0113067 A1 | 6/2003 | Koh et al. | |
| 2003/0116767 A1 * | 6/2003 | Kneissl et al. | 257/79 |
| 2003/0141507 A1 | 7/2003 | Krames et al. | |
| 2005/0017257 A1 * | 1/2005 | Green et al. | 257/98 |
| 2005/0094956 A1 | 5/2005 | Parker et al. | |

OTHER PUBLICATIONS

Schubert et al., "Resonant cavity light-emitting diode", Applied Physics Letters 60(8), Feb. 24, 1992, pp. 921-923 (published by the American Institute of Physics 1992).*

G. M. Laws, E. C. Larkins, I. Harrison, C. Molloy and D. Somerford. Improved refractive index formulas for the $Al_xGa_{1-x}N$ and $In_yGa_{1-y}N$ alloys. Journal of Applied Physics vol. 89, No. 2 Jan. 15, 2001. pp. 1108-1115.*

Optical Coating. Wikipedia, the free encyclopedia. http://en.wikipedia.org/wiki/Optical_coating. UL date: 11:51, Jul. 1, 2006. DL date: Jul. 6, 2006.*

Anti-Reflective Coating. Wikipedia, the free encyclopedia. http://en.wikipedia.org/wiki/Anti-Reflective_coating. UL date: 16:46, Jun. 10, 2006. DL date: Jul. 6, 2006.* www.luxpop.com. Index of Refraction Calculator. Search parameters are shown on printouts. Downloaded: Jul. 6, 2006.*

C. Rooman et al. "High-efficiency 650 nm thin-film light-emitting diodes," Proceedings of SPIE (2001), vol. 4278, pp. 36-40.

J.R. Wendt et al., "Nanofabrication of photonic lattice structures in GaAs/AlGaAs," J. Vac. Sci. Technol. B 11(6), (Nov./Dec. 1993), pp. 2637-2640.

M. Boroditsky et al., "Light extraction from optically pumped light-emitting diode by thin-slab photonic crystals," Applied Physics Letters, American Institute of Physics (1999), vol. 75, No. 8, pp. 1036-1038.

T.N. Oder et al., "III-nitride blue and ultraviolet photonic crystal light emitting diodes," Applied Physics Letters, American Institute of Physics (2004), vol. 84, No. 4, pp. 466-468.

H. Ichikawa et al., "Efficiency enhancement in a light-emitting diode with a two-dimensional surface grating photonic crystal," Applied Physics Letters, American Institute of Physics (2004), vol. 84, No. 4, pp. 457-459.

Han-Youl Ryu et al., "Enhancement of Light Extraction From Two-Dimensional Photonic Crystal Slab Structures," IEEE Journal on Selected Topics In Quantum Electronics, vol. 8, No. 2, (Mar./Apr. 2002), pp. 231-237.

Alexei A. Erchak et al., "Enhanced Extraction from a Light-Emitting Diode Modified by a Photonic Crystal and Lasing Action," National Science Foundation —#DMR-9808941, (Feb. 2003) pp. 43-45.

David et al., "Wide Angularly Isotropic Photonic Bandgaps Obtained From Two-Dimensional Photonic Crystals With Archimedean-Like Tilings", *Optics Letters*, vol. 25, No. 14, Jul. 15, 2000, pp. 1001-1003.

Luryl et al., "Quantum Effects and Hot-Electron Devices", *Modern Semiconductor Device Physics*, Ed.: S.M. Sze, John Wiley & Sons, New York (1998) (ISBN: 0-471-15237-4), pp. 253, 317.

A. Zukauskas et al., "Introduction to Solid-State Lighting", 2002, Chapter 5, pp. 82-91 and 112-115, ISBN 0-471-21574-0.

* cited by examiner

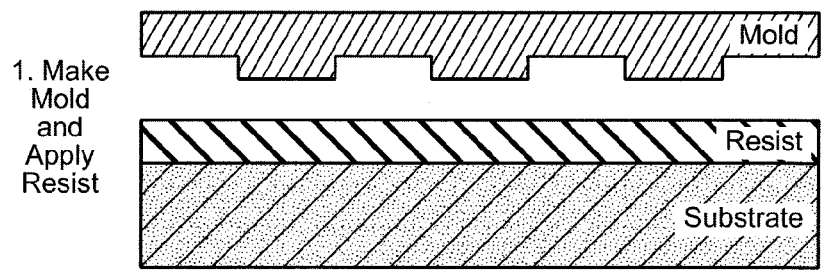
FIG. 7A — 1. Make Mold and Apply Resist
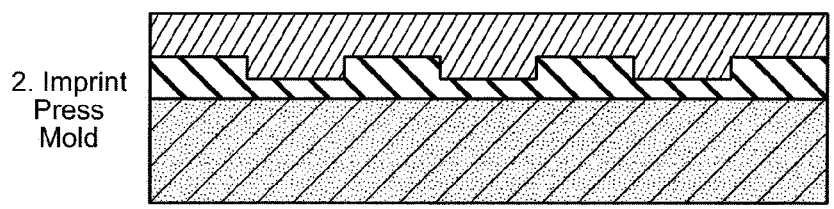
FIG. 7B — 2. Imprint Press Mold
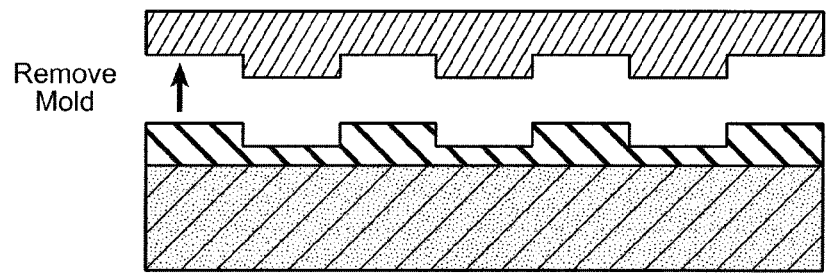
FIG. 7C — Remove Mold
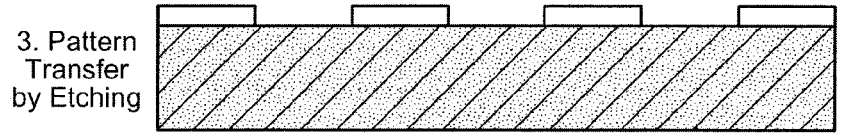
FIG. 7D — 3. Pattern Transfer by Etching
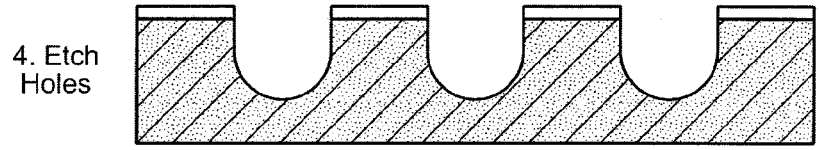
FIG. 7E — 4. Etch Holes

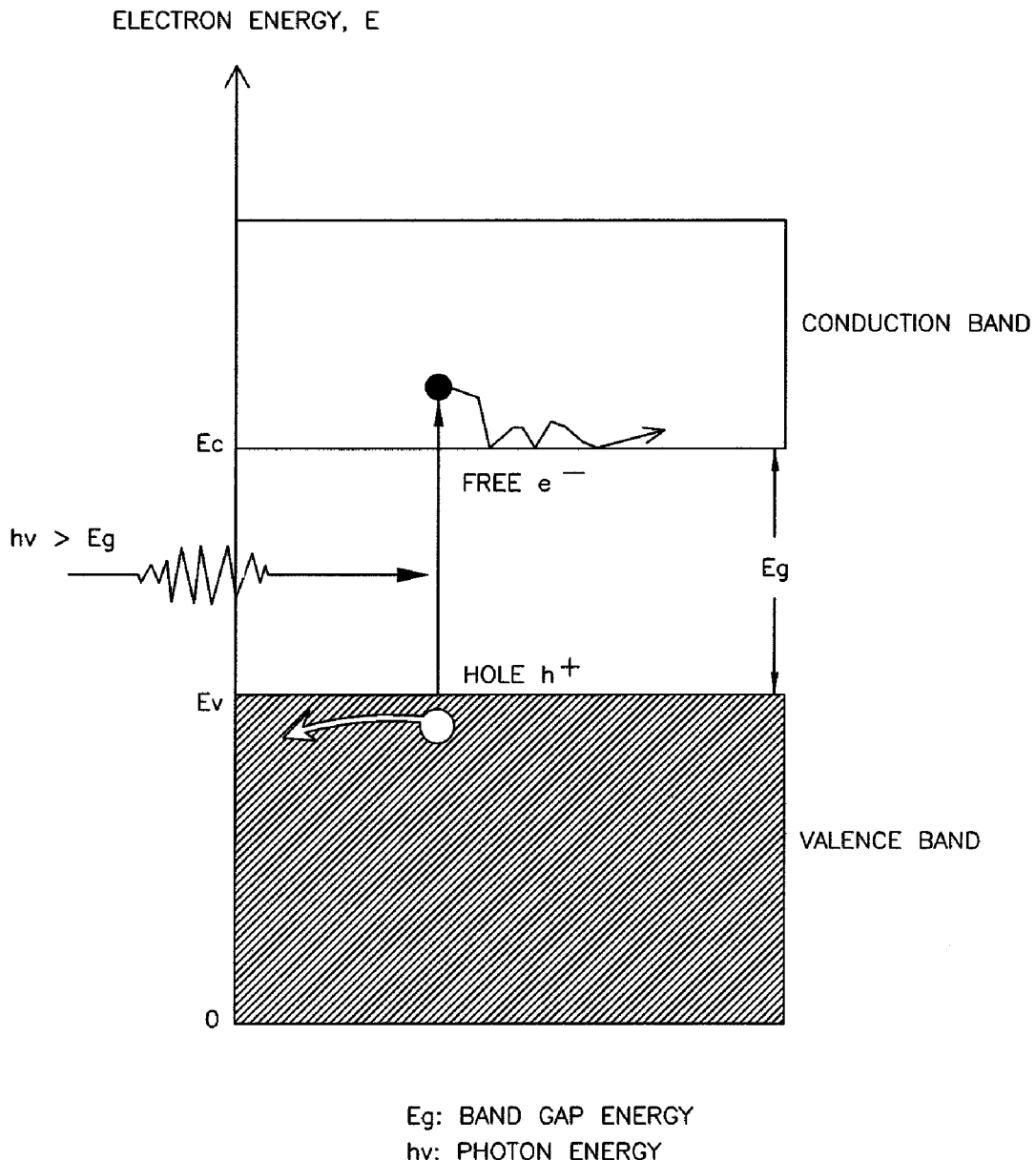
FIG. 8 A PHOTON WITH AN ENERGY GREATER THAN Eg CAN EXCITE AN ELECTRON FROM THE VALENCE BAND TO THE CONDUCTION BAND. IF hv<Eg, PHOTON IS NOT ABSORBED BY THE MATERIAL.

LIGHT EMITTING SYSTEM WITH HIGH EXTRACTION EFFICIENCY

BACKGROUND OF THE INVENTION

Rapid advances in solid state lighting systems such as high-brightness Light emitting diode (HB-LED) technology in the last decade have opened up the possibility of using LEDs as sources of general illumination in the not-too-distant future. Remarkable progress in LED efficiency, lifetime and total lumen output has enabled an early market in niche lighting applications such as traffic lights, brake lights, mobile phones, and outdoor signs. The rapid progress in LED technology has led to the belief that LED could have a significant impact on the lighting market within the next ten years. Illumination accounts directly for about 20% of U.S. electricity consumption. With advanced LED technology, the energy consumption can be reduced significantly.

The key components of the luminous performance are the internal quantum efficiency and the extraction efficiency. Utilizing high quality material and advanced epitaxial growth technologies such as Molecular Beam Epitaxy (MBE) and Metal-Organic Chemical Vapor Deposition (MOCVD) to facilitate band gap engineering such as Multiple Quantum Wells (MQWs) structure, the internal quantum efficiency is approaching 100%. In contrast, the extraction efficiency still needs much improvement. The extraction efficiency is the fraction of generated light that escapes from the semiconductor chip into the surrounding air or encapsulating epoxy, and is the fraction that is useful for illumination and other purposes. This is a challenging problem because the chip may have a much higher index of refraction, typically 3.4 for GaAs-based material, compared with 1.0 for air and approximately 1.5 for epoxy. This results in a critical angle of 17 degrees for air and 26 degrees for epoxy. If we consider a single surface, the light can only escape if it strikes the surface within the critical angle. Therefore, the extraction efficiency out of a single surface is only 2.2% into air and 4% into epoxy. The rest of light is reflected from the surface back into the active layer and reabsorbed by the semiconductor material or reflected at other surfaces.

The extraction efficiency is one of the main themes for improving the energy efficiency of LED. Methods such as random surface texture, grating thin film (U.S. Pat. No. 5,779,924), modifying chip geometry using, for example, truncated inverted pyramid (U.S. Pat. No. 6,323,063) and photonic crystal structure (U.S. Pat. No. 5,955,749 & US2003/014150) are implemented. None of these approaches is entirely satisfactory. It is therefore desirable to provide an improved LED with better characteristics.

SUMMARY OF THE INVENTION

The present invention proposes a novel configuration for the solid state lighting systems to achieve extraction efficiency and optical emission from electrical pumping in the active layer superior to the above-mentioned conventional methods. The present invention can also be used to manipulate the majority of light emission to emerge vertically from the wafer surface.

In an epitaxial structure of a solid state Light Emitting system, electrical current injection into the active layer is used to excite the photon emission. The present invention employs one or more structures (such as layers) different from the active layer for trapping the light generated by the active layer. Then another structure is used for extracting the light trapped. In one embodiment, the light generated by the active layer is trapped by means of a unique waveguide layer in the epitaxial structure to achieve high performance. The waveguide layer preferably traps a significant portion of the radiation generated by the active layer in a single mode (e.g. its fundamental mode) or a few lower-order modes. This is a completely new feature in solid state lighting system design. Furthermore, one embodiment of the present invention employs multiple photonic crystal regions located either outside or inside one or more current injection regions to extract photons from the waveguide layer(s). This novel design optimizes the interplay of electrical pumping, radiation and optical extraction to increase the optical output to several times that of conventional solid state lighting systems. In another embodiment, a transparent and conductive ITO layer is added to the surface of an epitaxial structure to reduce the interface reflection in addition to functioning as a current spreading layer. Each of the above-described features can be used separately or in conjunction with any one of the other features for improved performance. The present invention creates solid state lighting systems with high optical output and high power efficiency.

Thus, according to an embodiment of another aspect of the invention, the radiation generated by an active layer in a semiconductor structure in response to current injection is trapped, preferably in a single mode or a few lower-order modes, and the trapped radiation is extracted, preferably by means other than the means used to trap the radiation. In one embodiment, the trapping is performed by means of a waveguide layer which traps the radiation in its fundamental mode or a few lower-order modes. The extraction is preferably performed by means of photonic crystal structures.

In order to form the photonic crystal structures, which may be of nanometer dimensions, a layer of resist is formed on top of a semiconductor structure, and a pattern of indentations is formed on the resist layer by imprinting the pattern using a mold. A certain thickness of the resist layer is then removed, preferably by a process such as etching, to expose the surface of the semiconductor structure in a pattern that matches the pattern of indentations imprinted on the resist layer, while retaining a layer of resist that still covers the structure except for the pattern of exposed areas. A pattern of holes is then drilled, such as by etching, into the exposed areas of the semiconductor structure to form the photonic crystal structures. The making of the photonic crystal structures may be preferably performed after the semiconductor epitaxial structure is complete except for the formation of the photonic crystal structures and electrodes. The imprinting may be performed, in one embodiment, using a positive mold with protruding pillars, which preferably have cylindrical shapes. In one implementation, the mold may be made from replication from a negative mold made using electron beam lithography or Optical lithography.

BRIEF DESCRIPTION OF THE DRAWINGS

FIGS. 7A-7E are cross-sectional views of structures to illustrate a nano-imprint process used to create a photonic crystal pattern on a wafer, starting with the structure in FIG. 1.

FIG. 8 is a graphical plot of energy bands of a material to illustrate the band gap energy of the material.

DETAILED DESCRIPTION OF THE INVENTION

Figure 1:
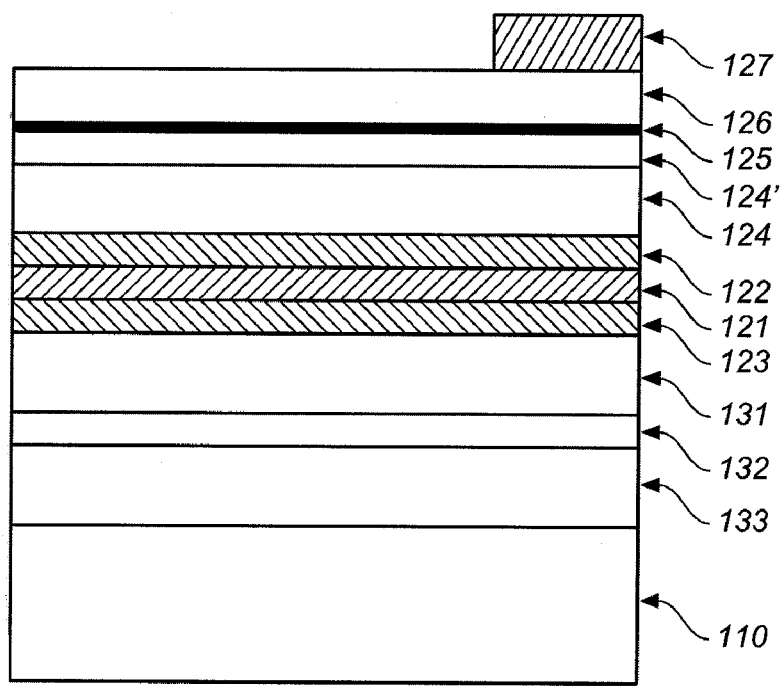
FIG. 1 is a cross-sectional view that shows an epitaxial structure having a waveguide structure and suitable for implementing a photonic crystal structure to illustrate an embodiment of the invention.

In order to illustrate one embodiment of the present invention directed to a solid state lighting system having a photonic crystal (PC) structure with clarity, we first present an epitaxial structure suitable for implementing photonic crystal and then add the photonic crystal structure into the epitaxial structure. FIG. 1 shows the epitaxial structure of the present invention without the PC structure. All epitaxial layers are grown on the top of the substrate 110. The substrate material is typically GaAs for red or yellow light emission structures and Sapphire, GaN or SiC for UV, blue and green light emission structures. Layer 121 is the active layer, where holes and electrons combine to emit light. The epitaxial structure of active layer 121 can be double heterostructure, multi-quantum wells (MQWs), or multi-quantum dots (MQDs) to optimize the internal quantum efficiency.

Holes and electrons combine in the active layer 121, causing light to be spontaneously generated from the layer. Then a large portion of emitted photons from the active layer 121 is trapped within the waveguide layers 122 and 123 as well as the active layer 121. Active layer 121 cannot serve as a waveguide core layer because usually it is very thin. In the present invention we arrange one or two additional waveguide layers with the refractive index close to that of the active layer and with the appropriate thickness. The index of refraction of the waveguide layers 122 and 123 is higher than that of the cladding layers 124 and 131, whose thickness(es) is more than 50 nm. The unstrapped light exits the semiconductor surfaces or is re-absorbed by the semiconductor structure in the same manner as in conventional LEDs. The waveguide layers, 122 and 123, are designed to allow the optical power to travel along the waveguide in one single mode or a few lower-order modes. To achieve such result, the thickness(es) of each of waveguide layers 122 and 123 is about 30 nm to 250 nm. Extraction by Photonic Crystal will not be effective if the waveguide supports a number of modes with quite different propagation constants because the band edge of PC structure may correspond to only one mode or a few modes. Prior LED epitaxial structures, such as the ones in Patent Application US 2003/0141507, do not contain any waveguide layer like the ones in embodiments of the present invention.

Layer 124' in FIG. 1 is a contact layer to provide a transition to an ultra thin metal layer 125, which is followed by an Indium Tin Oxide (ITO) layer 126. ITO layer 126 and Ultra thin metal layer 125 are used to increase current spreading over the wafer surface. Current spreading layers for LEDs are described in U.S. Pat. No. 6,958,494, which patent is incorporated by reference herein in its entirety. The ITO is transparent and conductive and its index of refraction is about 1.8. It also acts as an antireflection coating to reduce the Fresnel reflection at the air interface or the interface to external media such as encapsulating epoxy. Generally the Fresnel reflection at semiconductor epitaxial-air interface is high due to high index of semiconductor materials, which results in about 17% reflection at GaN-based material-air interface and 30% reflection at GaAs-based material-air interface. Therefore the ITO layer 126 plays a significant role on enhancing the optical output. Other conductive and transparent material, which has index of refraction lower than those of semiconductor layers, can be used to replace ITO as the material used for the current spreading layer which also reduces Fresnel reflection.

For minimizing reflection from the interface with air or other media, the thickness of ITO layer 126 is preferably equal to $\lambda/(4 n_{ito})$, where $\lambda$ is wavelength and $n_{ito}$ is the index of refraction of the ITO. The thickness of the ITO layer is about 89 nm for 640 nm optical emission and 65 nm for 470 nm optical emission. The thickness of ITO can range from 30 nm to 300 nm to cover emission from ultra-UV to near infrared. For some cases in the present invention, the ITO layer 126 and the ultra-thin metal layer 125 can be omitted without adversely affecting the extraction, but with lower optical output due to high reflection at the epitaxy-air interface. After the wafer epitaxial growth and/or the photonic crystal structure have been completed or formed, metal electrode 127 is deposited. The injection current from the electrode 127 flows through the active layer to electrically pump it to radiate. To reduce the loss of optical power through the substrate 110, a Distributed Bragg Reflector (DBR) layer 133 can be implemented to reflect the photons upward towards electrode 127. This layer 133 can be omitted without affecting the emission function of the solid state light emitting system. Buffer layer 132 is to provide a transition from the cladding layer 131 to the DBR layer 133. In view of the carrier transport in semiconductors, all semiconductor layers above the active layer 121 as shown in FIG. 1 can be either N-type or P type. The type of the semiconductor layers beneath the active layer 121 should be complementary to that above the active layer.

Figure 2:
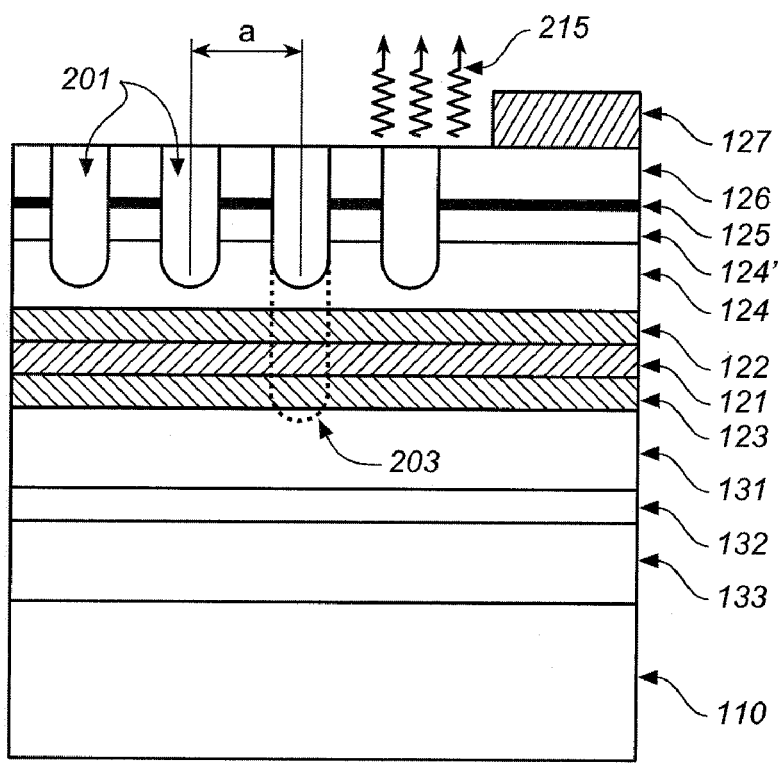
FIG. 2 is a cross-sectional view that shows that the holes are drilled through the epitaxial layers of the structure of FIG. 1 by a process such as chemical etching to improve light extraction.

FIG. 2 and FIG. 3 show how a light extraction structure can be implemented in conjunction with the waveguide structure for improved performance. In one embodiment, this light extraction structure comprises a photonic crystal structure. This structure of one embodiment of the present invention is created, starting with the structure in FIG. 1, for improved light extraction. The photonic crystal structure comprises many holes through some of the layers drilled into the epitaxial structure of the solid state light emitting system in FIG. 1, where the holes preferably form a two-dimensional pattern. The present invention illustrates novel patterns for optimizing light extraction. In one embodiment, the electrode region superposes a part of the photonic crystal region as shown in FIG. 4A. The injection current supplied from the electrode and current source (connection between the source and the electrodes not shown) is intended to spread out through the ITO layer over the full PC region as shown in FIG. 4A. In another embodiment, the optical extraction region where the PC is located is substantially separated from the current injection region as shown in FIG. 4B. Holes 201 in FIG. 2 are preferably created by chemical etching. The hole etching or drilling can be stopped at cladding layer 124 or waveguide layer 122 or the drilling or etching can even punch holes through the active layer 121 and waveguide layer 123 as indicated by dotted line 203. The hole diameter is in the range of 50 nm to 300 nm (nano-meters) for visible light. The lattice constant a of the PC, the distance from the center of a hole to the center of the adjacent hole in the lattice of the PC, is from 80 nm to 500 nm for visible light. The lattice constant generally increases with the emitting wavelength and with the band number of the PC structure. The electrical field extending from the active layer 121 to the cladding layer 124, which is induced by the collective photons produced in the active layer 121, strongly interacts with the PC structure. At certain values for parameters of PC structure such as lattice constant and hole diameter as indicated below, the PC structure inhibits the photons from residing in the waveguide but emit vertically out of the wafer surface as indicated by 215 in FIG. 2.

FIG. 2 shows that the holes 201 are drilled from the top of the wafer. But when the wafer bonding technique is used, the holes can be imbedded from layers 131 or 123 or even through the active layer 121 into waveguide layer 122 and cladding layer 124. Wafer bonding technique is to flip over the epitaxial structure by taking out the original substrate such as 110 and then bond a new substrate on the original top layer such as the layer 124' if the ITO layer 126 in FIG. 2 is omitted. FIG. 8 is a graphical plot of the energy bands of a material to illustrate the band gap energy of the material. Where the photons directed to the material have less energy than the band gap, the photons do not have enough energy to excite the electrons in the material. Consequently the photons will pass through the material and not be absorbed by the material. If the new substrate has a band gap that is wider than that of the active layer, this means that the photons emitted by the active layer will not have sufficient energy to excite electrons in the new substrate and will not be significantly absorbed by the new substrate, so that light can be emitted from both sides of the solid state light emitting system. This may be advantageous for some applications. For example, where GaAs is the material in the original substrate for the solid state light emitting system, a material with a band gap that is wider than that of GaAs may be used, such as GaP.

Figure 3A:
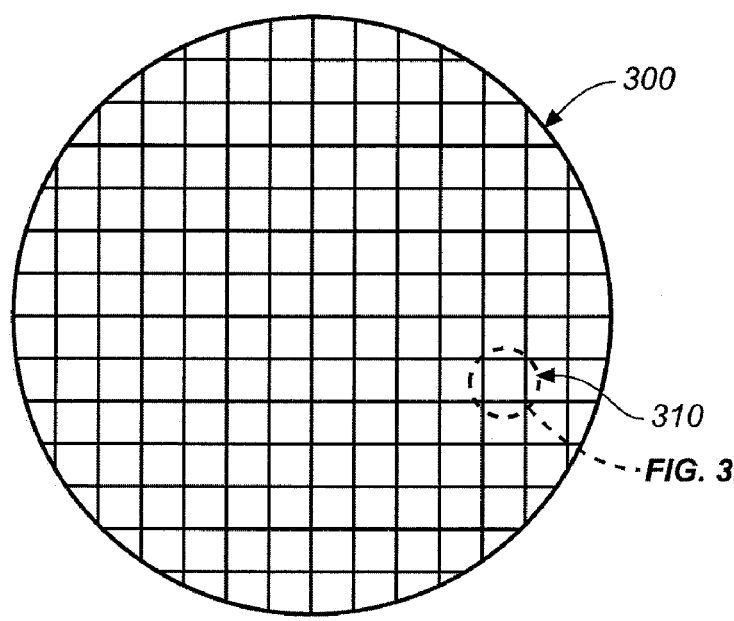
FIGS. 3A-3D show the arrangement of photonic crystal pattern and current electrodes from the wafer level to the individual hole for LEDs to illustrate an embodiment of the invention.
Figure 3B:
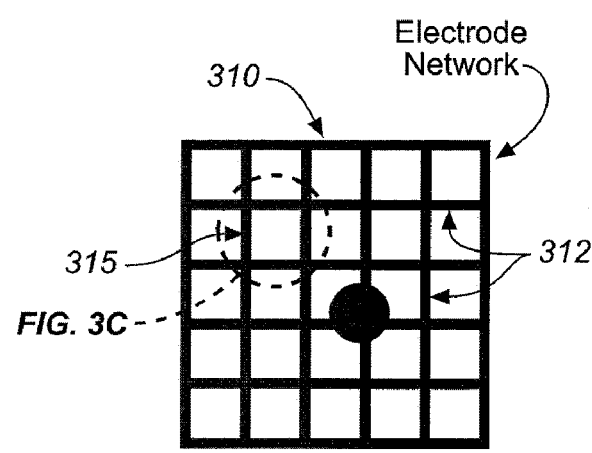
Figure 3C:
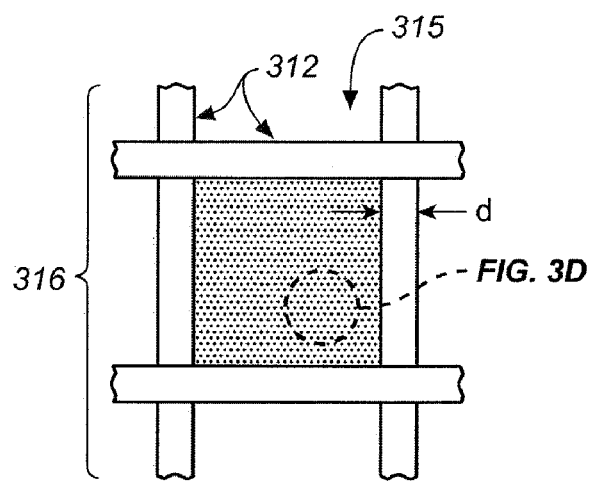
Figure 3D:
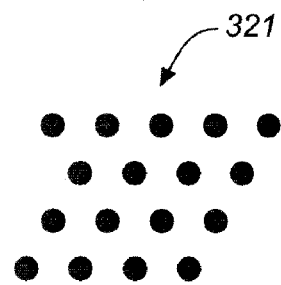
Figure 4A:
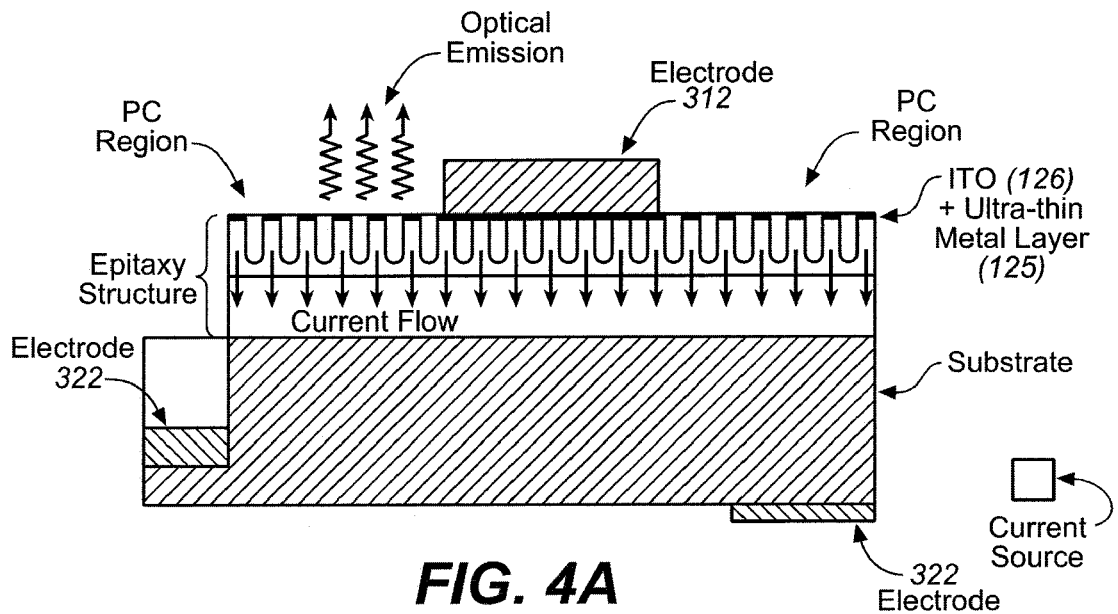
FIG. 4A is a cross-sectional view that shows one embodiment with electrode region overlapping a part of photonic crystal region.
Figure 4B:
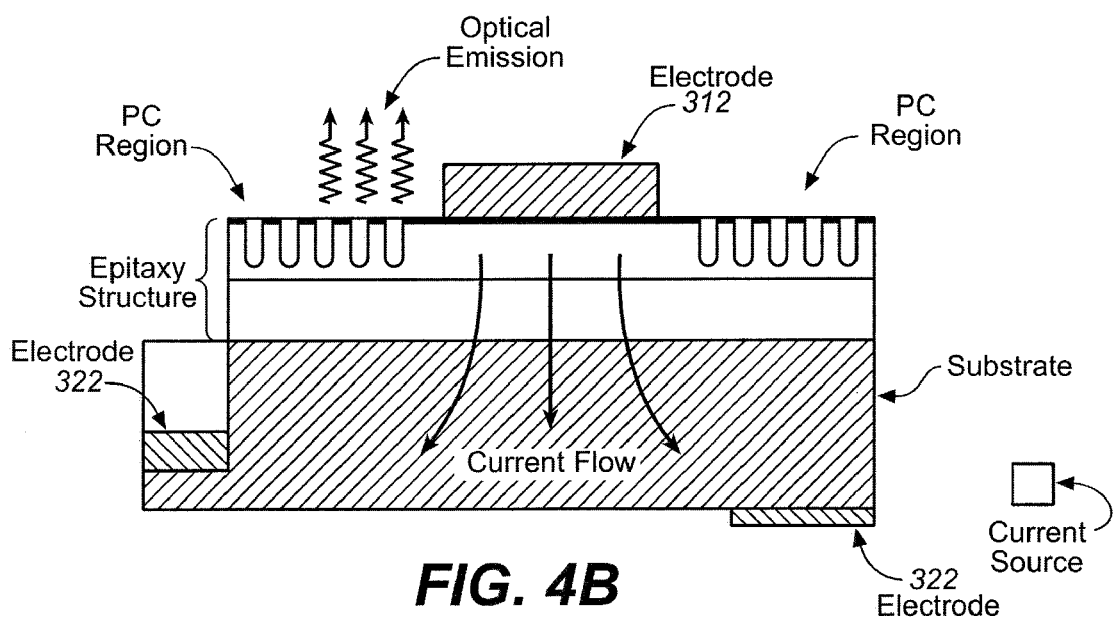
FIG. 4B is a cross-sectional view that shows another embodiment with the current injection regions substantially segregated from the photonic crystal regions.

FIGS. 3A-3D are schematic views showing the arrangements of photonic crystal pattern and current electrodes from the wafer level to the individual hole that can be used in the solid state light emitting system of FIGS. 1, 2, 4A and 4B. In lighting applications, the wafer 300 in FIG. 3A is broken into many chips 310, one of which is shown as indicated by the blow-up view of FIG. 3B. Each chip 310 has a side with length in the range of 50 to 500 µm. Within each chip 310, an electrode network 312 run across the chip surface vertically and horizontally to spread current more evenly. Each of the networks 312 may have a grid-shaped pattern as shown in FIG. 3B, where the pattern is formed by interconnected vertical and horizontal electrically conductive strips. Each of the network 312 therefore comprises a plurality of grid cells 316, each grid cell formed by two vertical strip segments and two horizontal elongated strip segments of the electrically conductive strips, where the segments are interconnected at their corners to form square or rectangular grid cells. Each grid cell 316 encloses a corresponding PC cell. The width d (see FIG. 3C) of the electrode strips in electrode networks 312 is about 1 to 100 µm. Each of the Photonic Crystal (PC) cells 315 is enclosed by a corresponding one of the grid cells in each of the electrode networks 312. Therefore there are many photonic crystal cells 315 in each chip. The size of each PC cell ranges from 1 to 100 µm on each side. The holes in a triangular array as indicated by 321 are created inside the PC cell and beneath the electrodes as shown in FIG. 4A. Other hole arrays such as square or rectangular grid is also usable. The ITO layer 126 is used to spread the injection current supplied by the electrode over the full photonic crystal region. Therefore the current injection region, i.e. emitting region, overlaps the photonic crystal region, i.e. light extraction region.

To simplify the figures, the configuration for the current electrodes as illustrated in FIGS. 3A-3D (and in FIGS. 5 and 6 described below) are not shown in some of the remaining figures of this application, it being understood that the electrodes in such remaining figures (e.g. FIG. 4B) may take the shape in FIGS. 3A-3D, 5, 6 or still other shapes.

In another embodiment, there is no hole beneath the electrode as shown in FIG. 4B. Current is injected by means of a current source (connection between the source and the electrodes not shown). The ITO layer 126 and ultra-thin metal layer 125 in FIG. 1 can be either kept or omitted for this case (the ITO layer is removed from FIG. 4B). Therefore the current injected primarily runs from the electrode 312 through the active layer 121 to the second electrodes 322 near the substrate, without passing through the portion of the epitaxial structure of the solid state light emitting system where the photonic crystal region is located. The photonic crystal region, which has holes, may have higher electrical resistance such that it is preferable to pass the current along paths away from this region. In this embodiment, the current injection region is substantially segregated from the photonic crystal region, which functions to extract light from the waveguide. One of advantages of this embodiment is to avoid the carrier (holes or electrons) loss in the photonic crystal region due to the defect and depletion on and near hole surfaces. The width of the electrode strips in network 312 (see FIG. 3C) is also optimized to have sufficient photons emitted in the active region underneath but having sufficient separation between the strips to allow the photons to travel between the electrode strips to reach the PC cell to emerge from the solid state light emitting system to be used for various purposes (such as illumination) without being significantly reabsorbed. The other advantage of this embodiment is that it allows the current injected into the chip to be at elevated current density without overheating the semiconductor layers.

Figure 5:
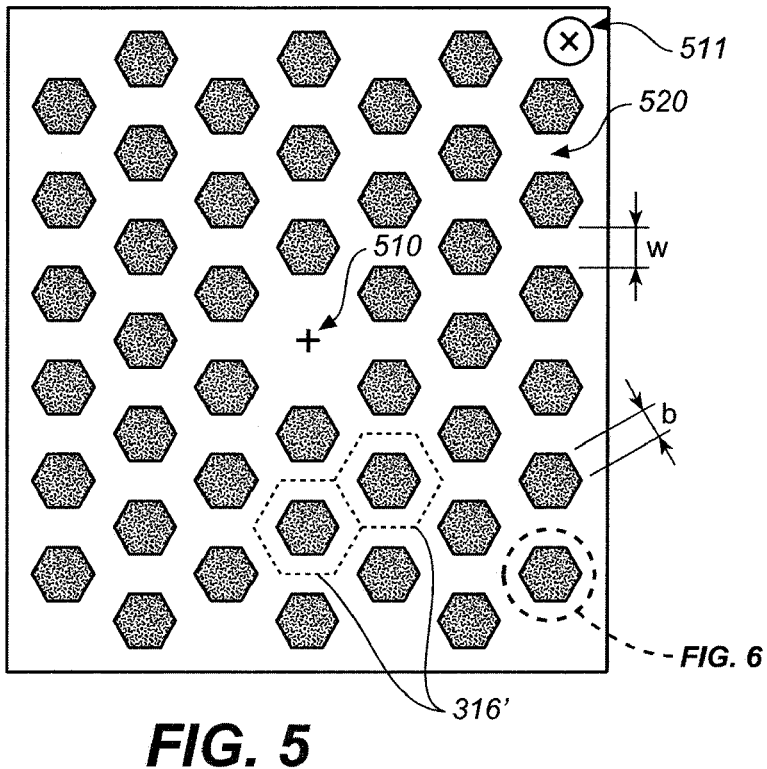
FIG. 5 shows an example of hexagonal PC cells arranged in a chip for LEDs.
Figure 6:
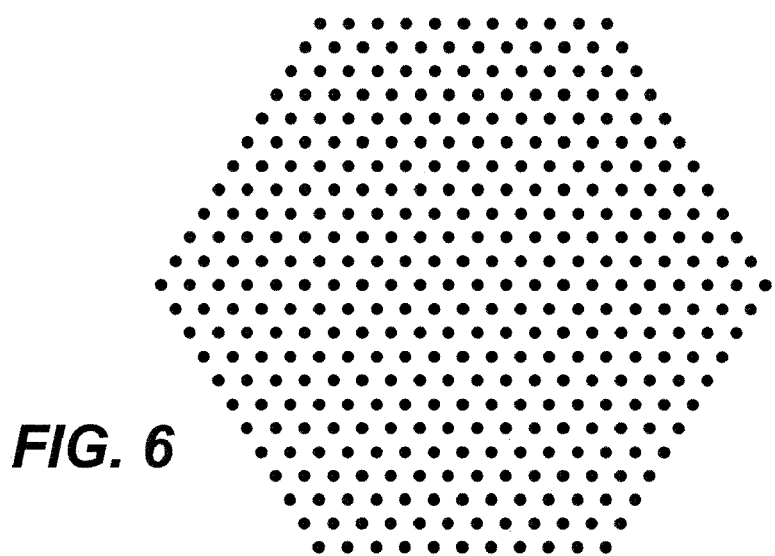
FIG. 6 shows the triangular array of holes fits into a hexagonal cell for LEDs.

Inside the chip, the geometrical shapes of photonic crystal cells and electrodes can be arranged in many ways for the sake of optimizing optical and electrical performance of the solid state light emitting chip. FIG. 5 shows an example of hexagonal PC cells arranged in a chip. The hexagonal shape allows the photonic crystal to interact photons from all directions more effectively. Hexagonal cells are surrounded by electrode network 520 (white area in FIG. 5). As in the case of FIGS. 3A-3D, since the hexagonal-shaped openings in the electrode (each opening in the electrode exposing a corresponding hexagonal PC cell) are arranged in a periodic array, arrays of network cells 316' of the electrode that are substantially similar to one another can be defined for the electrode in FIG. 5 as well. The term "network cell" therefore can be defined to encompass both the grid cells 316 of FIGS. 3A-3D and those (316') of FIG. 5. The wire connected to the electrical power source can be bonded at 510 or at the edge 511. According to the theoretical calculation for the optimal performance for the case of no holes beneath the electrode 520, the electrode width W between two adjacent hexagonal cells is preferably approximately equal to $\sqrt{3}\, b$, where b is the length of a side of the hexagon. FIG. 6 shows the triangular array of holes fitting into a hexagonal PC cell. Other shape arrangements are feasible and within the scope of the present invention.

The lattice constant and hole diameter of photonic crystal structure in the low order bands for visible light and UV are of the order of 100 nanometers. To create the PC arrays is a challenging task. At low throughput, electron beam lithography can be used to write the PC pattern, but is very slow. In the present invention, nano-imprint technology is introduced to create the PC pattern in mass production scale prior to the drilling of the holes by chemical etching. The main technique of nano-imprint consists of three basic components: a stamp with suitable feature sizes, a material such as photoresist or UV epoxy to be printed and equipment for printing with adequate control of printing conditions such as temperature and pressure.

FIGS. 7A-7E illustrate the nano-imprint process and its associated etching. As indicated above, the PC cells comprise holes of very small dimensions, which holes can be formed using the nano-imprint process of FIGS. 7A-7E. The mold for making the nano-imprint in the Step 1 can be made by either electron beam lithography or Optical lithography. In the present invention, electron beam lithography is preferably used to make a mold with protruded nano-scale cylindrical pillars (positive mold) or nano-scale recessive holes (negative mold). Negative mold is used to replicate positive daughter molds for printing. For example, electron beam lithography or Optical lithography may be used to first make a negative mold, which is used in turn to replicate positive daughter molds that are actually used for the printing process.

A layer of resist is applied to the structure in FIG. 1 with the substrate 110 as support, since the surface layers of the structure in FIG. 1 may not be soft enough for making the nano-imprint. The material of the resist is typically a polymer such as PMMA and UV-cured epoxy. In step 2, the mold is pressed onto the resist layer, and then removed, to leave a pattern of indentations in the resist layer. In the steps 3 and 4, the etching can be carried out by ion-assisted chemical etching, reactive ion etching (RIE), induced coupled plasma (ICP) etching, physical sputtering and other methods. The etching is done to remove a certain thickness of the resist from the structure in FIG. 1. Since the pattern of indentations in the resist layer causes the resist to have a smaller thickness at the indentations, removal of a sufficient thickness of the resist from the substrate will expose regions of the structure in FIG. 1 where the pattern of indentations is located, while leaving the remainder of the resist to shield the rest of the structure surface. Therefore, the etching in steps 3 and 4 will result in holes being etched into the structure in FIG. 1 to form the solid state light emitting systems of FIGS. 2, 4A and 4B.

While the invention has been described above by reference to various embodiments, it will be understood that changes and modifications may be made without departing from the scope of the invention, which is to be defined only by the appended claims and their equivalents. All references referred to herein are incorporated by reference herein in their entireties.

We claim:

1. A solid state light emitting diode device comprising:
   an active layer emitting incoherent light in response to current injected into the layer;
   a first structure comprising at least one waveguide layer adjacent to the active layer and two cladding layers wherein said active layer and said at least one waveguide layer are located between the two cladding layers, wherein an index of refraction of said at least one waveguide layer is higher than that of the cladding layers, said structure trapping the incoherent light generated by the active layer; and
   a second structure comprising a photonic crystal structure adjacent to the first structure extracting the incoherent light that is trapped by the first structure and outputting incoherent light.

2. The device of claim 1, wherein the first structure contains substantially a single optical mode or a few lower-order optical modes, and traps the light generated in the said optical mode(s).

3. The device of claim 1, wherein the at least one waveguide layer has a thickness between about 30 nm to 250 nm.

4. The device of claim 1, further comprising a transparent and conductive layer over the first structure.

5. The device of claim 1, further comprising an Indium Tin Oxide layer over the at least one cladding layer.

6. The device of claim 5, said Indium Tin Oxide layer being electrically conductive, substantially transparent and has an index of refraction of about 1.8, said Indium Tin Oxide layer serving as an interface of the device with air or other media.

7. The device of claim 5, wherein the Indium Tin Oxide layer has a thickness in a range of about 30 to 300 nm.

8. The device of claim 5, wherein the Indium Tin Oxide layer has a thickness of about 89 nm for 640 nm optical emission by the device, or about 65 nm for 470 nm optical emission by the device.

9. The device of claim 5, wherein the Indium Tin Oxide layer has a thickness substantially equal to $\lambda/(4n_{ito})$, where $\lambda$ is wavelength of light generated by the active layer, and $n_{ito}$ is the index of refraction of the Indium Tin Oxide layer.

10. The device of claim 5, further comprising a metal layer between the Indium Tin Oxide layer and the active layer.

11. The device of claim 1, wherein the photonic crystal structure comprises at least one array of holes in the device.

12. The device of claim 11, said second structure comprising at least one layer, wherein the photonic crystal structure comprises at least one array of holes in said at least one layer.

13. The device of claim 11, said at least one array of holes forming a two dimensional array.

14. The device of claim 13, further comprising at least one electrode layer through which current is injected into the active layer.

15. The device of claim 14, said at least one electrode layer having a grid-shaped pattern, or a pattern with hexagonal openings therein.

16. The device of claim 15, said second structure comprising a plurality of arrays of holes, each array located so that it is enclosed by a grid cell or exposed through a hexagonal opening in said at least one patterned electrode layer, wherein each array extracts light from the first structure and causes the extracted light to escape through a corresponding hexagonal opening of the electrode layer, or an area bounded by adjacent strips of a grid-shaped electrode layer.

17. The device of claim 15, said array of holes of the photonic crystal structure forming a triangular pattern, said photonic crystal structure comprising a plurality of photonic crystal cells, each photonic crystal cell having a hexagonal shape within each of the hexagonal openings in the electrode.

18. The device of claim 15, said electrode layer comprising elongated strips forming a network, wherein a width of the strips is in a range of about 1 to 100 μm.

19. The device of claim 14, said device comprising a plurality of semiconductor chips, said photonic crystal structure comprising a plurality of photonic crystal cells, said at least one electrode layer comprising a network on each chip enclosing at least one of the photonic crystal cells.

20. The device of claim 19, said network comprising a plurality of grid cells, each grid cell enclosing a photonic crystal cell.

21. The device of claim 20, said grid cells being square or rectangular in shape.

22. The device of claim 20, each photonic crystal cell within a grid cell having a dimension in a range of about 1 to 100 μm.

23. The device of claim 14, wherein there is no hole abutting and underneath the at least one electrode layer.

24. The device of claim 13, said holes forming a triangular, square or rectangular array.

25. The device of claim 11, wherein a lattice constant of said at least one array of holes is in a range of about 80 to 500 nm, and the holes have diameters in the range of about 50 nm to 300 nm.

26. The device of claim 1, said photonic crystal structure comprising a plurality of photonic crystal cells, each photonic crystal cell having a dimension in a range of about 1 to 100 μm.

27. The device of claim 1, further comprising a substrate layer.

28. The device of claim 27, wherein the substrate layer has a band gap that is wider than that of the active layer, so that light emitted by the active layer is not absorbed significantly by the substrate layer, and so that light emitted by the active layer is emitted from both sides of the device.

29. A solid state light emitting device comprising:
an active layer emitting light in response to current injected into the layer;
a first structure adjacent to the active layer, said structure trapping the light generated by the active layer, said first structure comprising at least one waveguide layer adjacent to the active layer, said at least one waveguide layer and the active layer trapping the light generated by the active layer;
a substrate layer; and
a second structure adjacent to the first structure extracting the light that is trapped by the first structure, wherein the substrate layer has an electronic band gap that is wider than that of the active layer, so that light emitted by the active layer is not absorbed significantly by the substrate layer, and so that light emitted by the active layer is emitted from both sides of the device, wherein the second structure comprises holes that extend through the first structure and the active layer to a region between the substrate and the active layer, wherein the light extracted by the second structure and outputted from the device is incoherent.

* * * * *